United States Patent [19]
Robbins et al.

[11] Patent Number: 5,473,287
[45] Date of Patent: Dec. 5, 1995

[54] ELECTRONIC OSCILLATOR WITH TRANSMISSION LINE TUNING OF PHASE NOISE AND LINEARITY

[75] Inventors: David F. Robbins, Westford, Mass.; Richard J. Landry, Epping, N.H.

[73] Assignee: Micronetics, Inc., Hudson, N.H.

[21] Appl. No.: 337,759

[22] Filed: Nov. 14, 1994

[51] Int. Cl.$^6$ ............................ H03B 5/18; H03B 5/32
[52] U.S. Cl. ............... 331/99; 331/107 SL; 331/117 D; 331/177 V; 331/116 R; 331/158
[58] Field of Search ............... 331/96, 99, 107 DP, 331/107 SL, 117 D, 117 V, 116 R, 158

[56] References Cited

U.S. PATENT DOCUMENTS

| | | | |
|---|---|---|---|
| 4,621,241 | 11/1986 | Kiser | 331/117 R |
| 4,733,199 | 3/1988 | Khanna | 331/99 |
| 4,737,737 | 4/1988 | Khanna | 331/47 |
| 4,998,077 | 3/1991 | Nanni et al. | 331/99 |
| 5,130,675 | 7/1992 | Sugawara | 331/117 D |
| 5,225,793 | 7/1993 | Higashiyama et al. | 331/158 |
| 5,231,361 | 7/1993 | Smith et al. | 331/56 |
| 5,325,064 | 6/1994 | Leanes et al. | 324/638 |

OTHER PUBLICATIONS

Coaxial Resonators & Inductors Trans Tech Pub 50030170 (May 1990).
Using Coaxial Line Elements As Inductors Feb. 2, 1994 Trans Tech Application Notes.

*Primary Examiner*—Siegfried H. Grimm
*Attorney, Agent, or Firm*—Vernon C. Maine

[57] ABSTRACT

An improved electronic oscillator of limited bandwidth for better phase noise and linearity characteristics, and method for production, where a transmission line of specific characteristics is introduced between major components of the frequency source to significantly improve phase noise and linearity, and minor adjustments to the L/C ratio of the transmission line during production testing further optimize phase noise and linearity without adverse effects on other circuit parameters. The improvement chiefly relates to the length, configuration and accessibility of a transmission line connecting a resonator and main tuning capacitor in a series resonant tank circuit of an oscillator.

20 Claims, 6 Drawing Sheets

ELECTRONIC OSCILLATOR WITH TRANSMISSION LINE TUNING OF PHASE NOISE AND LINEARITY

TECHNICAL FIELD

This invention relates generally to electronic circuits and more particularly to a method and apparatus resulting in improvements to the phase noise and linearity of voltage-controlled oscillators.

BACKGROUND

The design of high frequency oscillators has often been described as being as much of an art as a science. There is an ever-pressing demand to improve the performance, manufacturability and cost of voltage-controlled oscillators in the rapidly expanding microwave, satellite and wireless communications field.

Advances in the field of high frequency electronic oscillators have included the development and wide spread use of alternatives to traditional coil and capacitor-based frequency sources, variously known as and including coaxial and waveguide cavities, stripline resonators, SAW devices, pucks, pills and lumped elements, ceramic resonators, YIG sphere or quartz crystals and dielectric resonators.

Conventional circuit analysis such as disclosed in Kiser's U.S. Pat. No. 4,621,241, Nov. 4, 1986, aids in understanding the interrelationship of components and component sizing in such circuits, and Higashiyama et al's U.S. Pat. No. 5,225,793, Jul. 6, 1993, discloses the conventional analysis of a ceramic resonator as the frequency source in an oscillator circuit. However, the academic exercise is often inadequate to predict or explain the actual performance of high frequency components and circuits which may be highly sensitive to parasitic components and other anomalies caused by individual component design, relative position, orientation and electrical connections.

Designers often do not have enough time, assets or justification to indulge in lengthy and expensive analysis or major redesign of a marginally performing circuit layout. There is inevitably a tweaking in the design stage, which may continue into the manufacturing stage, wherein component changes and other small changes are made and tested for affect on the parameters of interest until a suitable performance compromise is reached.

For example, in a DC voltage-controlled oscillator with a ceramic resonator in the tank circuit as a frequency source, a reverse bias is commonly applied to a varactor by a DC signal voltage to control the output frequency of the oscillator. A capacitive coupling component is required to block the DC voltage and transfer the resultant AC component of the frequency source to the amplifier section. The coupling capacitance must be kept high in order to keep the circuit Q as high as possible, but it must be kept low enough to avoid affecting the frequency, linearity and bandwidth. Finally, phase noise must be kept to a minimum. Increasing the size of the coupling capacitor between the frequency source and the amplifier section will tend to increase circuit Q, but at some point will also increase the phase noise and decrease the linearity for a given circuit layout, as the size of the coupling capacitor begins to affect the overall capacitance of the system. Decreasing the capacitance will decrease the overall circuit "Q," and at some point begin to increase phase noise again. A "sweet spot" for coupling capacitance in a given circuit can be calculated and ascertained by testing, but if phase noise is still excessive, the production tester is forced to contemplate other circuit or component changes to improve phase noise. The problem being that other component changes that improve phase noise tend to bring tradeoffs in other parameters such as frequency and bandwidth.

SUMMARY OF INVENTION

The primary goal of the invention, simply stated, is a novel configuration and methodology for manufacturing electronic oscillators at ultra high frequencies (above about 500 MHz), with bandwidths of up to fifteen percent (15%), that significantly improves the linearity and the phase noise performance in the offset range of one hundred kilohertz (100 kHz) to one megahertz (1 MHz), including means to fine tune the L/C ratio and impedance matching of components in the tank circuit of oscillators during production testing for further improvements to phase noise and linearity which will reduce rework and improve yields.

The term "resonator", when used herein without further descriptive qualification, means any one or combination of traditional electronic components and other known or as yet unknown elements or lumped elements which exhibit a tendency to oscillate at one or more resonant frequencies when used in an electronic oscillator circuit.

An object of the invention is to have an oscillator with a resonant tank circuit in which there is a resonator, a main tuning capacitor, a transmission line for matching the impedance of the resonator and the main tuning capacitor, and an amplifier with a feedback loop to overcome circuit losses and sustain the oscillations at the resonant frequency of the tank circuit. Where the resonator and the main tuning capacitor are the primary components of the frequency source, and the transmission line connects the resonator and the main tuning capacitor, the transmission line is therefore a critical element in matching the impedance of the resonator and main tuning capacitor, and consequently in the establishment of the circuit Q, phase noise, and linearity of the oscillator.

A further object of the invention is to have the transmission line be a trace on a substrate with a uniform dielectric constant on a circuit board connecting the resonator and the main tuning capacitor. In addition to its critical placement in the circuit, the transmission line is configured to be between one and three sixteenths (1/16–3/16) wavelengths of the resonant frequency of the oscillator in length. This length and width of transmission line in this place in the circuit has been found to have an unexpected result of up to 6 decibels improvement in phase noise and up to 10% improvement in tuning linearity over other common configurations.

A yet further object of the invention is to have the transmission line physically accessible for tuning adjustments between the resonator and the main tuning capacitor in the tank circuit after the circuit board is populated and ready for electrical testing. To this end the transmission line is laid out as a relatively wide strip or land or trace on a printed circuit board with room between components for physical access to the strip after the board is populated with components. The land is laid out to be longer than the physical distance between the terminals of the resonator and the main tuning capacitor, and is configured with at least one elbow or curve. During electrical testing or production testing or final testing, as it may be called, the transmission line can be trimmed to reduce it's surface area in specific locations in order to increase the L/C ratio to better match the impedance of the resonator to the main tuning capacitor and improve Q of the tank circuit, slightly. Alternatively, stubs of excess material or small jumpers can be added to the transmission line to decrease the L/C ratio to again better match the resonator and main tuning capacitor and improve the Q of the tank circuit, slightly.

It has been found that such minor tuning adjustments to the L/C ratio in the immediate connection between principal components of the frequency source in the pre-amplified stage of the circuit provide simple, easily controllable, effective means of optimizing the phase noise and linearity performance of individual oscillators during production, with significantly less impact on frequency and bandwidth than other techniques, and helps to achieve uniformally good results in the production run, without resorting to the replacement or addition of other components or making other circuit modifications.

A still yet further object of the invention is to have an oscillator be a variable frequency oscillator where there is an externally provided signal parameter that is used to adjust or make changes to the resonant frequency of the oscillator.

Another still yet further object of the invention is to have an oscillator be a voltage-controlled oscillator (VCO) where the main tuning capacitor is a varactor diode, the anode end of which is connected by the transmission line to the resonator, and across the varactor diode is applied a DC signal voltage which applies a reverse bias to the diode, thereby changing its capacitance and changing the resonant frequency of the oscillator.

An additional object of the invention is to have a voltage-controlled oscillator with a coupling capacitor between the amplifier stage and the signal voltage being applied to the diode so that the DC component of the signal voltage is blocked, and the AC component, or electrical oscillations at the resonant frequency, are not.

A further additional object of the invention is to have a VCO with a coil or a ceramic resonator or other suitable component as it's resonator, and optionally a fixed capacitor in parallel with the resonator, to provide further flexibility to the design.

A still further additional object of the invention is to have a VCO with the main tuning capacitor fixed, and the coil or other inductive component variable so as to provide frequency adjustment.

In summary, the location, length and width of a transmission line connecting the resonator and main tuning capacitor of an electronic oscillator in accordance with the present invention improves the impedance match of the resonator and the main tuning capacitor and provides the unexpected results of significantly improving the average phase noise and linearity performance of the design in production; while accessibility to the land of the transmission line, after the board is populated, enables the manufacturer to readily fine tune the match and the phase noise and linearity characteristics of individual units to assure uniformally close conformance to the intended specification during production runs.

The invention admits of many variations, and is further expressed and described herein by its apparatus and methodology.

DESCRIPTION OF PREFERRED EMBODIMENT

Figure 1:
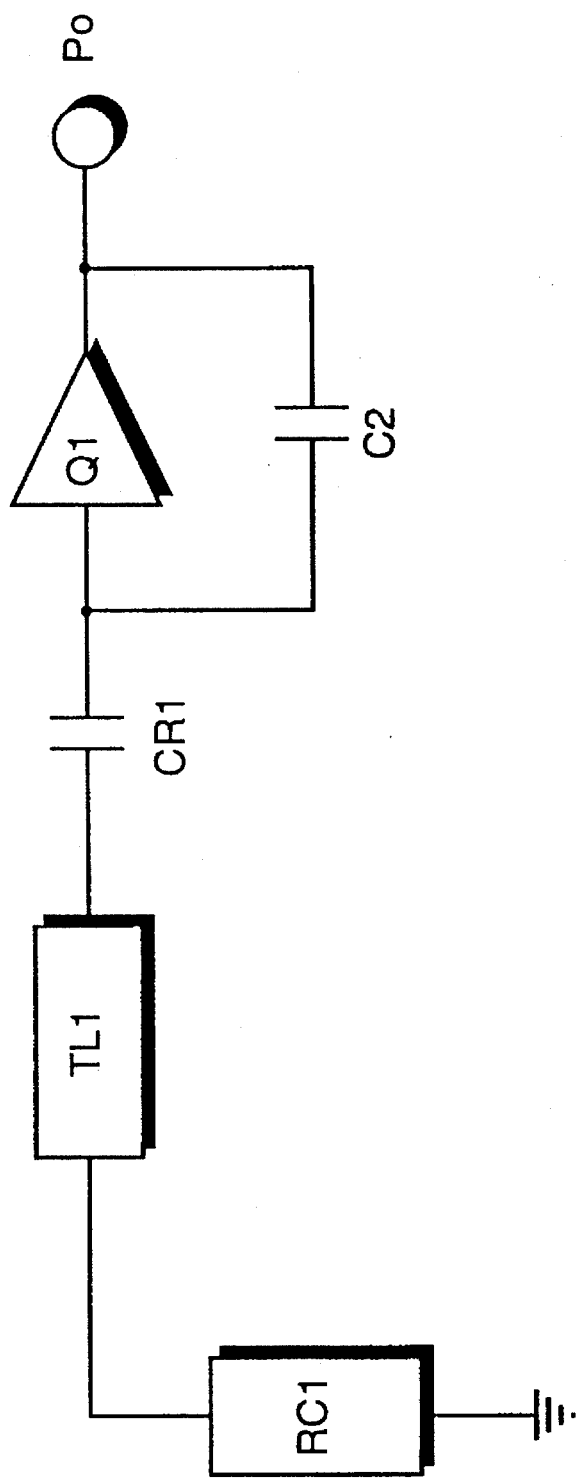
FIG. 1 is a schematic diagram of a simplified electronic oscillator circuit with a ceramic resonator, transmission line, main capacitor, amplifier and feedback capacitor.

The main purpose of the invention is a circuit design and layout configuration for an electronic oscillator with a bandwidth of up to about fifteen percent (15%), and methodology for manufacturing it, which improves the linearity, and phase noise performance at ultra high frequencies (above about 500 MHz), and includes means to fine tune individual oscillators to optimize linearity and phase noise during production testing without disturbing other components on the board and without undue effect on overall circuit Q or bandwidth. The invention admits of many variations and applications, some of which are discussed here, others of which will be readily apparent to one of ordinary skill in the art.

For example, the invention may be an oscillator such as a Colpitts or modified Colpitts circuit, with a resonant tank circuit in which there is some type of a resonator, a main tuning capacitor, and an amplifier with a feedback loop to overcome circuit losses and sustain the oscillations at the resonant frequency of the tank circuit, where the resonator and the main tuning capacitor are the primary components of the frequency source and a matching transmission line connects the resonator and the main tuning capacitor, and is therefore a critical element in the establishment of the resonant frequency and Q of the frequency source in the pre-amplification stage, and the resultant phase noise of the oscillator.

A further example of the invention is a transmission line made as a land on a substrate of uniform dielectric constant on a circuit board connecting the resonator and the main tuning capacitor of an oscillator. In addition to its critical placement in the circuit, the transmission line is configured to be between one sixteenth and three sixteenths (1/16–3/16) wavelengths of the resonant frequency of the oscillator in length. This length of transmission line in this place in the circuit has been found to improve the impedance match of the resonator and the main tuning capacitor, and have an unexpected result of up to 6 decibels improvement in phase noise and up to 10% improvement in tuning linearity over other common configurations.

A yet further example of the invention is to have the transmission line physically accessible for tuning adjustments after the circuit board is populated and ready for electrical testing. The transmission line is laid out at the design stage as a relatively wide strip or land or trace on a substrate with a uniform dielectric constant on a printed circuit board with room allowed between components to provide for physical access to the transmission line after the components have all been inserted and soldered to the board. The land is laid out by design to be longer than the physical distance between it's end points which are the terminals for the resonator and the main tuning capacitor.

The land is configured with a corner or C or S curve so that during functional testing of the completed oscillator circuit, the transmission line trace can be trimmed by slicing off a small amount of trace material off an outside corner of the trace to reduce it's surface area and increase it's effective length, increasing the overall L/C ratio of the tank circuit and improving the impedance match between the resonator and the main tuning capacitor slightly. Alternatively, stubs of excess material or small jumpers can be soldered onto the transmission line trace across inside corners to increase its surface area and shorten it's effective length, decreasing the overall L/C ratio of the tank circuit and likewise improving the impedance match between the resonator and the main tuning capacitor slightly. Frequency being a function of the product of the total inductance L and capacitance C of the tank circuit, the ratio can be adjusted to improve Q without affecting frequency.

Such adjustments on a transmission line of this length, at this place in the circuit, provide simple, easily controllable, effective means of optimizing the phase noise and linearity performance of individual oscillators during production testing, without adversely affecting frequency or bandwidth, and help to achieve uniformly good results in the production run without resorting to the replacement or addition of other components or the making of other circuit modifications.

A still yet further example of the invention is a variable frequency oscillator where there is an externally provided signal that is used to adjust or make changes to the resonant frequency of the oscillator.

Another still yet further example of the invention is a voltage-controlled oscillator (VCO) where the main tuning capacitor is a varactor diode, the anode end of which is connected by the transmission line to the resonator, and across the varactor diode is applied a DC signal voltage, by any of various known circuit arrangements, which applies a reverse bias to the diode in proportion to the applied signal voltage, thereby changing the varactor diode's effective capacitance and changing the resonant frequency of the oscillator.

An additional example of the invention is a voltage-controlled oscillator with a coupling capacitor between the amplifier stage and the signal voltage and cathode end of the diode so that the DC component of the signal voltage is blocked, and the AC component of the frequency source, particularly the electrical oscillations at the resonant frequency, is not.

A further additional example of the invention is a VCO with a coil or a ceramic resonator or other suitable component as it's resonator, and optionally with a fixed capacitor in parallel with the resonator, to provide further flexibility to the frequency source of the design.

A still further additional example of the invention is a VCO with the main tuning capacitor fixed, and connected via the transmission line of the invention to a variable or adjustable range resonator or coil or other inductive component, so as to provide an alternate method of frequency control to the oscillator.

Other examples and variations will be apparent to one of ordinary skill in the art. The invention, and a preferred embodiment, is herein described with reference to the figures.

Referring now to FIG. 1, there is shown a simplified oscillator circuit which includes a series resonant tuned tank circuit with ceramic resonator RC1, transmission line TL1, main tuning capacitor CR1, amplifier Q1, feedback signal capacitor C2, and output terminal $P_o$. The side of resonator RC1 opposite its connection to capacitor CR1 is shown connected to ground. The resonant frequency of the oscillator is primarily determined by the series tuned combination of ceramic resonator RC1, transmission line TL1, and main tuning capacitor CR1.

Figure 3:
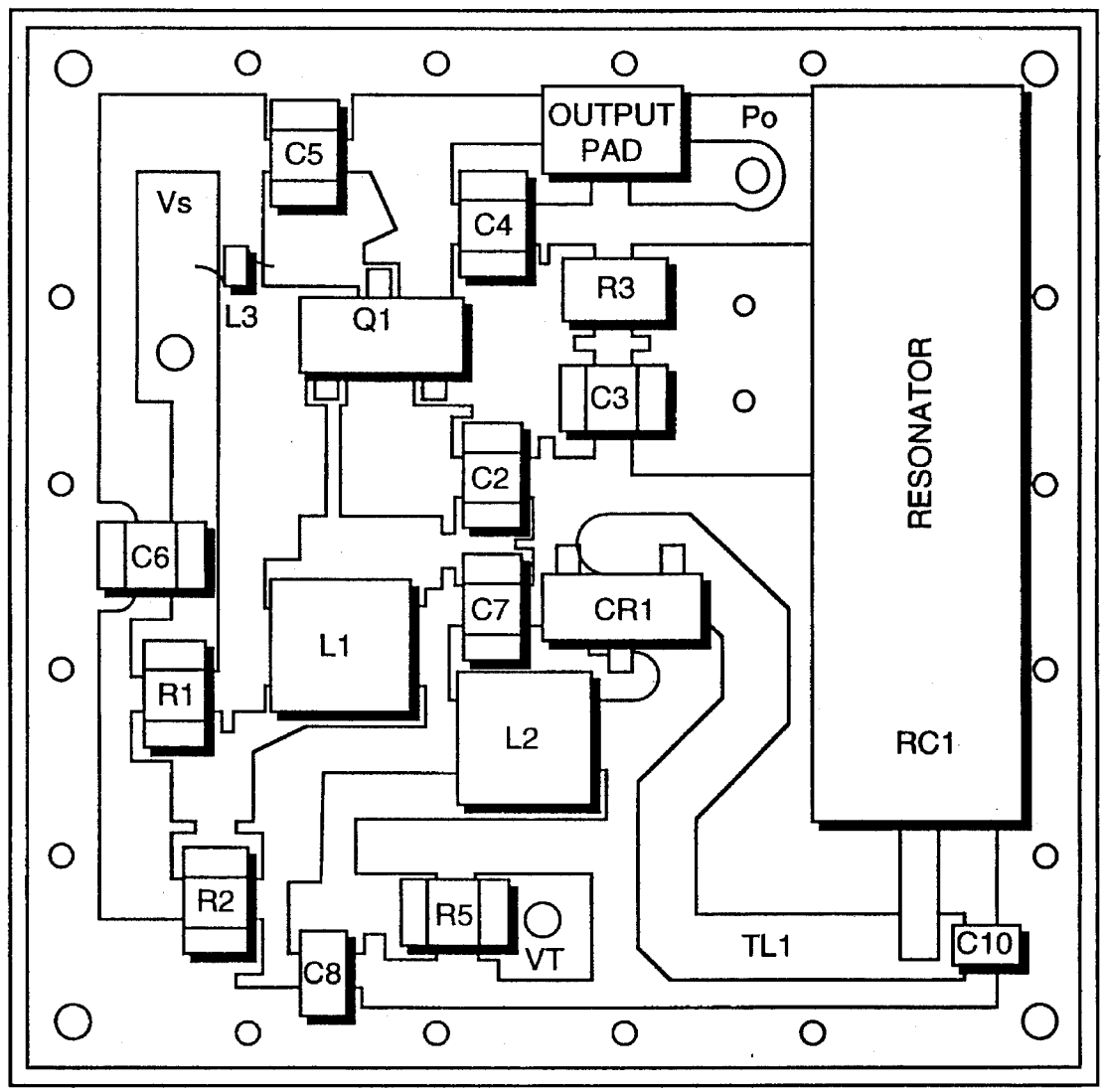
FIG. 3 is a diagram of a printed circuit board illustrating the configuration of a transmission line between the resonator and main tuning capacitor, according to the present invention.
Figure 4:
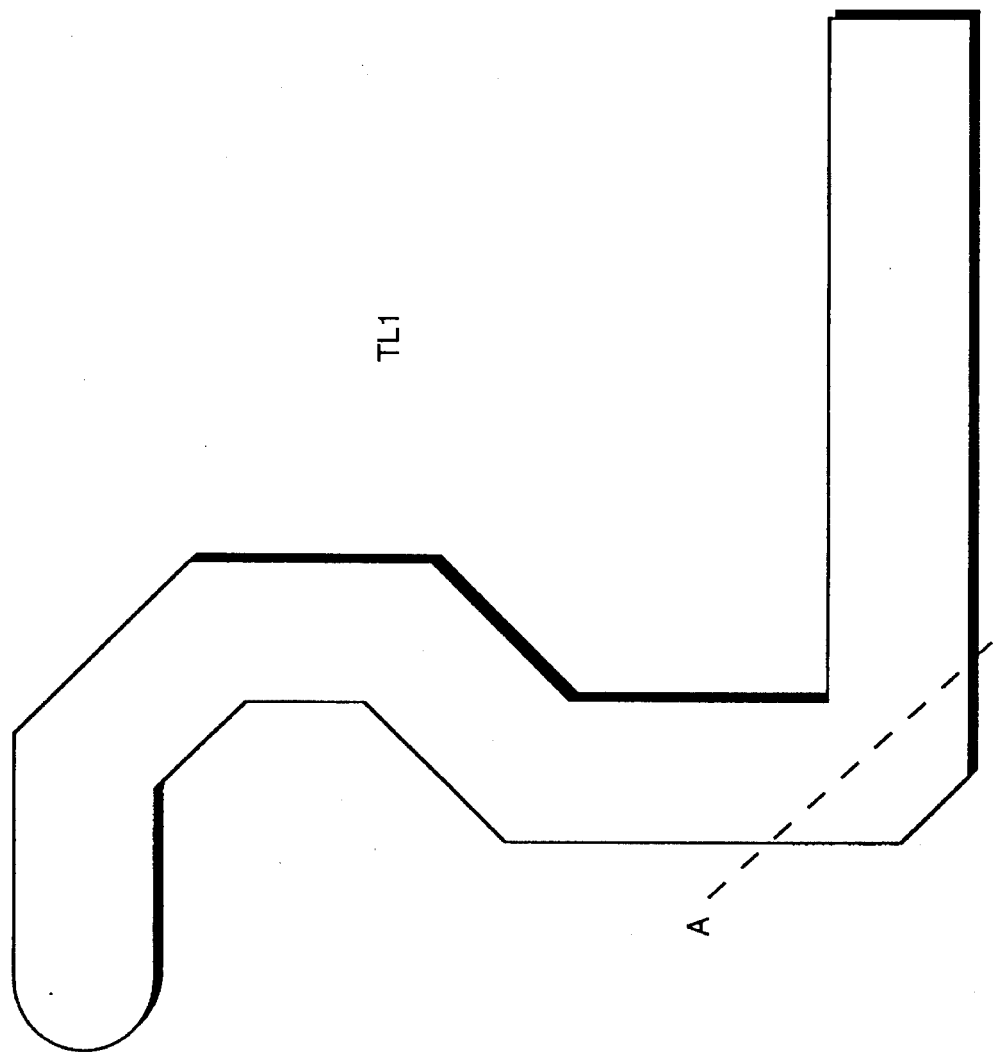
FIG. 4 is a diagram of a trace of the printed circuit board of FIG. 3 illustrating the method of the present invention where the transmission line of FIGS. 1, 2, and 3 has been altered slightly during production testing, by trimming a portion of the land to increase it's L/C ratio and improve the impedance match between resonator and main tuning capacitor, to tune the oscillator for the best linearity and phase noise response.
Figure 5:
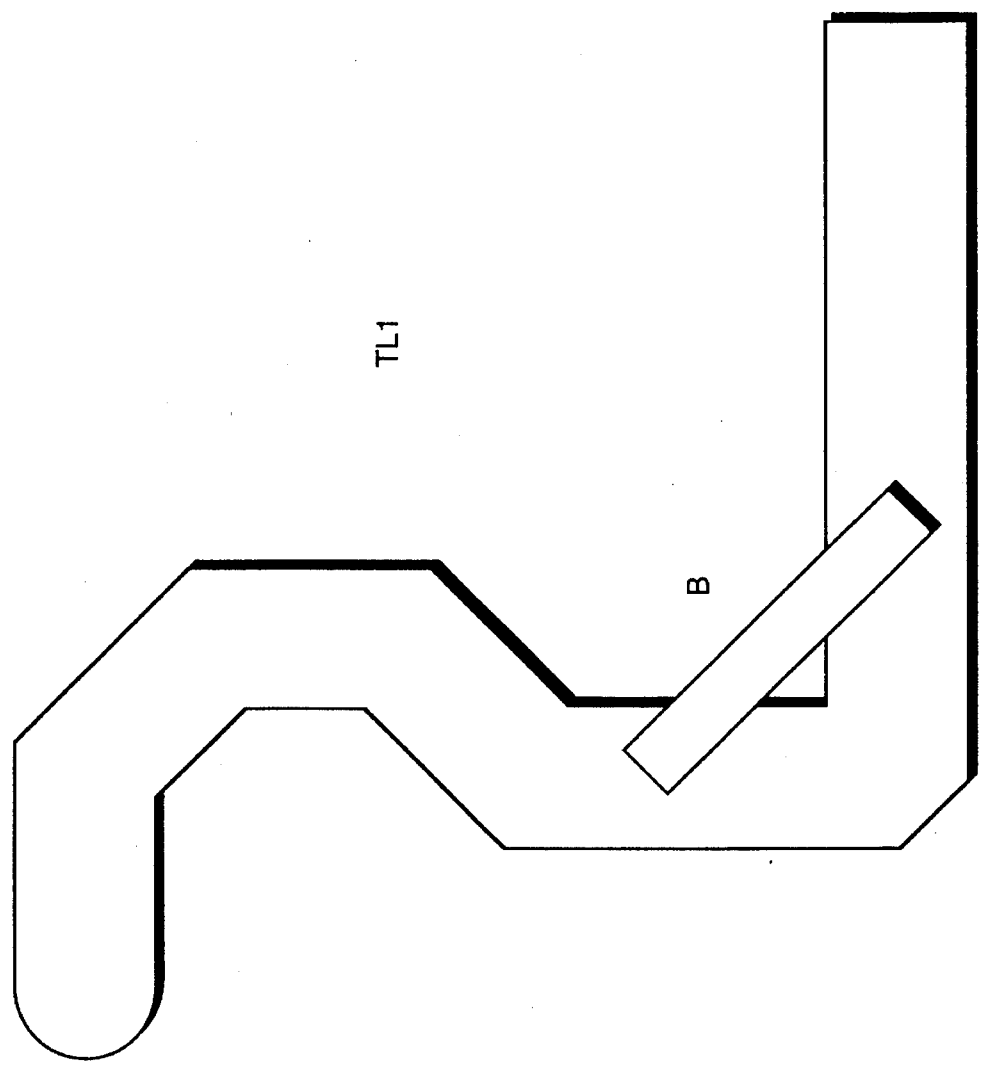
FIG. 5 is a diagram of a trace of the printed circuit board of FIG. 3 illustrating the method of the present invention where the transmission line of FIGS. 1, 2 and 3 has been altered slightly during production testing, by soldering a small jumper across a corner of the land to decrease it's L/C ratio and improve the impedance match between resonator and main tuning capacitor, to tune the oscillator for the best linearity and phase noise response.

Transmission line TL1 is configured in a preferred embodiment as illustrated on the circuit boards of FIGS. 3, 4 and 5. It is between one sixteenth and three sixteenths (1/16–3/16) wavelengths of the center frequency in length, forty to fifty thousandths (0.040 to 0.050) of an inch wide on a substrate of uniform dielectric constant, and configured approximately in an "S" shape between the termination points where resonator RC1 and main tuning capacitor CR1 are inserted and soldered to the board.

Ceramic resonator RC1, which serves as the inductance means for the tank circuit, may be a variable inductor used to change the resonant frequency of the tank circuit. In this instance main tuning capacitor CR1 may be a fixed value. The inductance means may also be a tuned cavity or crystal resonator.

Figure 2:
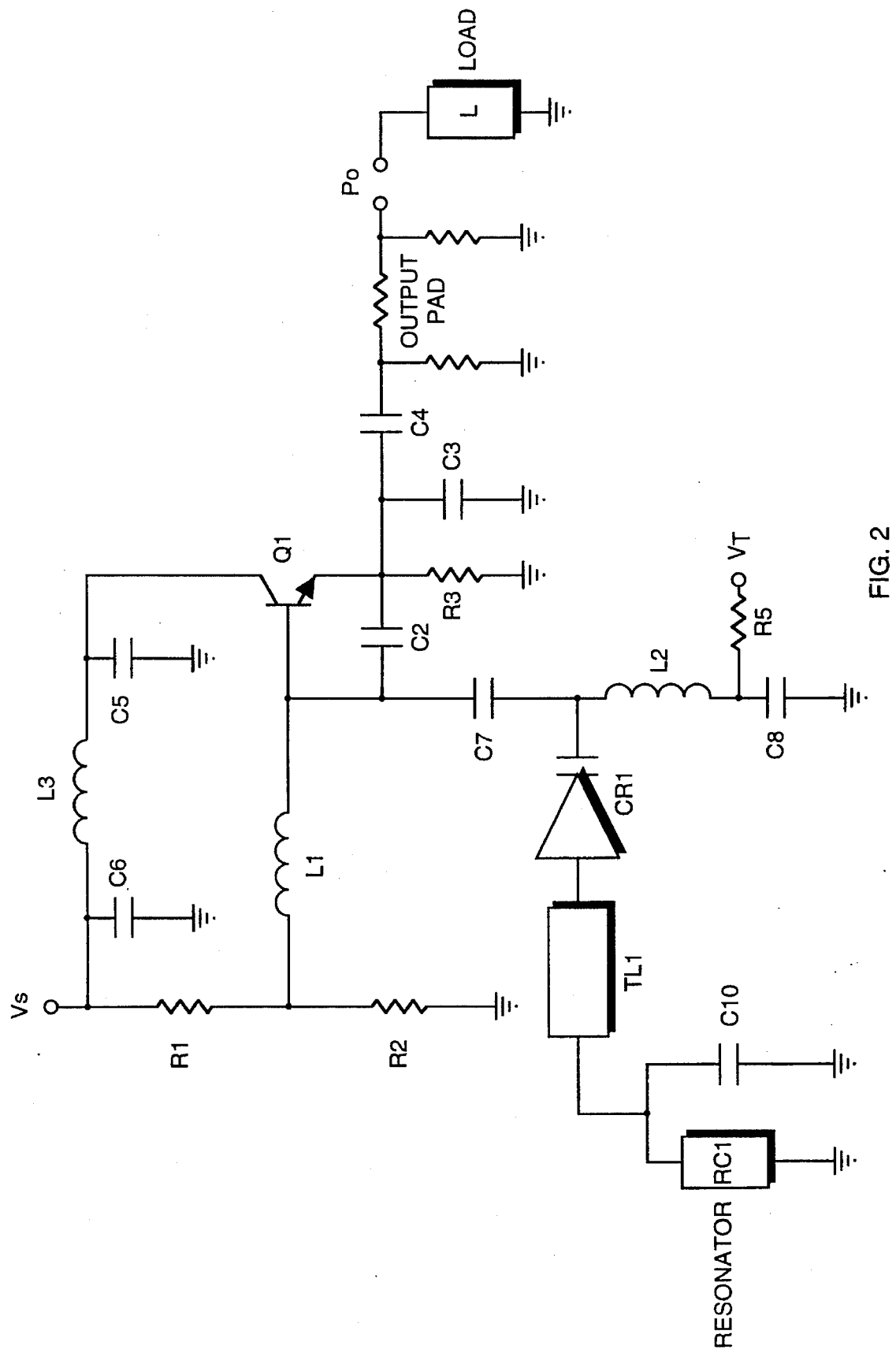
FIG. 2 is a schematic diagram of a voltage-controlled oscillator (VCO) circuit with a ceramic resonator and a fixed capacitor in parallel as the frequency source, transmission line, and varactor diode in the tank circuit, and a coupling capacitor to isolate the DC signal voltage from the amplifier and output section.

Referring now to the voltage-controlled oscillator of FIG. 2, the main tuning capacitor is varactor diode CR1. Optional fixed capacitor C10 is shown in parallel with resonator RC1. Transmission line TL1 is configured as described in FIGS. 3, 4 and 5. The design bandwidth of the circuit of FIG. 2 may be five to ten percent (5–10%) of the middle frequency.

DC voltage tuning input terminal $V_T$ is connected through a resistor R5 and a inductor L2 to tuning capacitor CR1 to apply a DC voltage bias to capacitor CR1. More specifically, terminal $V_T$ supplies a positive voltage at the cathode electrode with respect to the anode electrode of varactor diode CR1. Resistor R5 is of a high value so as not to load the Q of the tank circuit. Resistor R5 may be an RF choke, a high impedance active device such as a transistor, or another network presenting a high RF impedance and a controlled DC resistance.

An RF bypass capacitor C8 is connected between R5 and L2 to ground to provide a low pass filter and thereby short out any RF signals. Capacitor C8 is a low reactance at minimum oscillator frequencies and a high reactance at maximum anticipated modulation frequencies.

The feedback loop for sustaining the oscillations in the tank circuit includes feedback signal capacitor C2, and amplifier Q1. Amplifier Q1 as shown is an active device and specifically is an NPN transistor having the base and emitter electrodes connected in the feedback loop.

A feedback output impedance in the form of a resistor R3 is shown connected between the transistor emitter which is the feedback output of amplifier Q1, and ground. Resistor R3 may be replaced with a choke, an output transformer, a filter or other network which looks like a high impedance at RF frequencies, and a controlled bias impedance to DC.

A DC voltage supply terminal $V_s$ is connected through a inductor L3 to the collector electrode of the transistor to supply a DC feed voltage thereto. A resistor R1 is connected to inductor L3 and inductor L1 to the base of the transistor to connect inductor L1, resistor R1 and inductor L3 between the base and collector electrodes of the transistor. Resistor R2 is connected through inductor L1 to the base of the transistor and to ground. In this way resistors R1 and R2 are selected to provide the proper DC bias for the transistor and are selected to have a sufficiently large value so as not to degrade the Q of the tuned circuit. Resistors R1 and R2 may be replaced with other networks such as chokes or may be absent as required to provide the proper bias conditions for the transistor.

The power output is shown as being taken from the emitter of the transistor. An AC output coupling and impedance matching arrangement is connected to the emitter of the transistor and to power output terminal $P_o$ which includes capacitor C4 between the emitter and power output terminal $P_o$.

The output coupling and impedance matching can be accomplished in a number of ways which include a choke, resistor, filter, or other network which matches the active device to the desired output load. A load L is shown connected to terminal $P_o$. It is understood that the output power can be taken from other points in the circuit, as is commonly known in the art.

In the operation of the above described oscillator the LC resonant tank circuit oscillates at a frequency $$F=1/[2\pi(L \times C_{total})^{1/2}]$$

where L is the total inductance and C is the total capacitance in the tank circuit, including the resonator, varactor diode and transmission line. A portion of the feedback output of amplifier Q1 is applied by capacitor C2 to the tank circuit and to the input of amplifier Q1 to sustain oscillations.

In order not to reduce the effective value of CR1, and thereby reduce tuning range, coupling capacitor C7 should be much smaller in value than CR1. Values of C7 equal to one tenth (1/10) the maximum value of CR1 are typical. Capacitor C7 could be replaced by a conductor in applications where capacitor CR1 is a mechanical DC isolated capacitor itself or, conversely, CR1 is a fixed DC isolated value and resonator RC1 is varied to change the resonant frequency of the oscillator.

Figure 6:
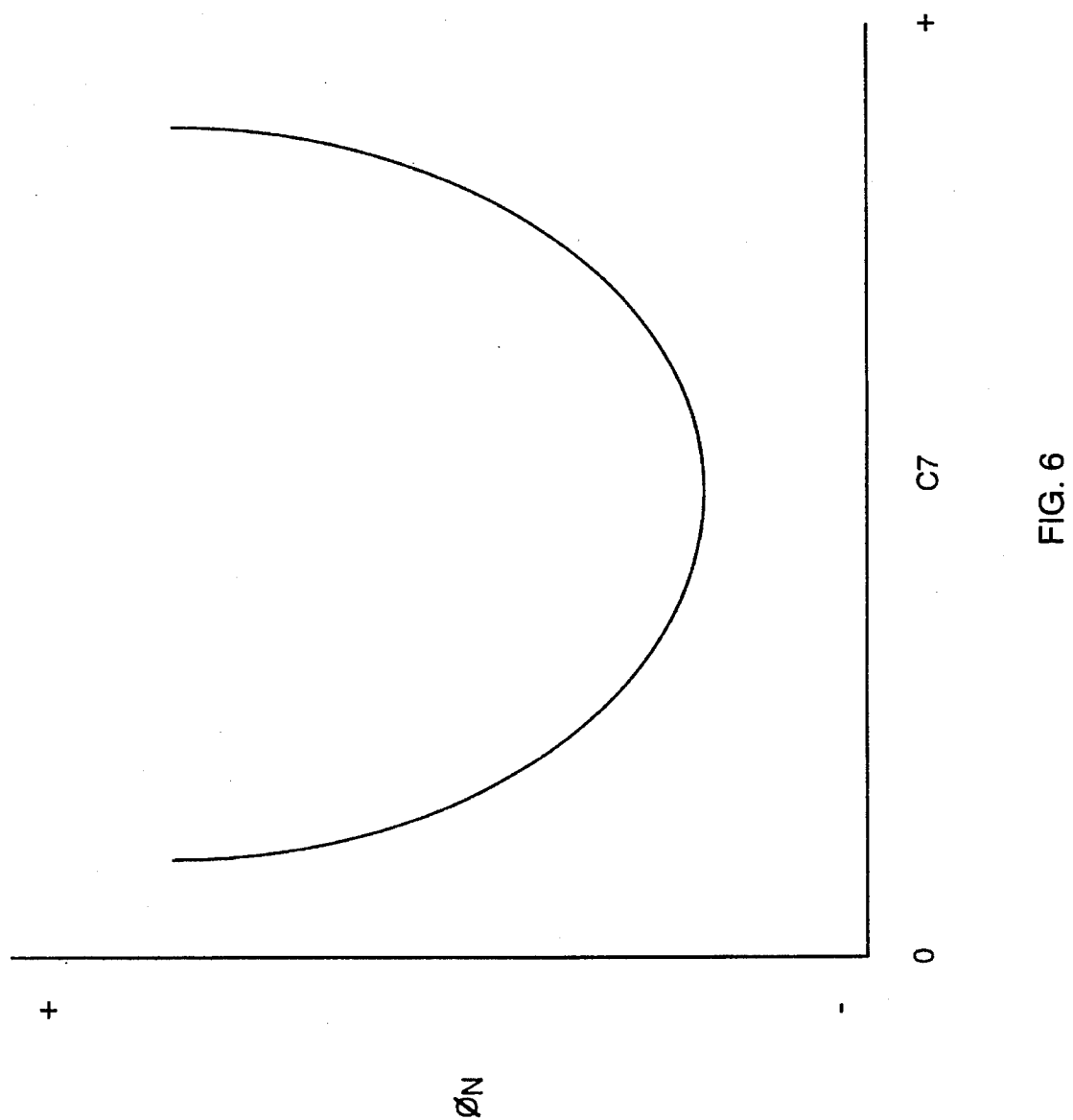
FIG. 6 is a simplified chart of phase noise versus capacitance of a coupling capacitor in voltage-controlled oscillator of FIG. 2.

However, the value of coupling capacitor C7 must not be too high, while at the same time the Q factor of the oscillator must be kept as high as practical, in order to achieve optimal phase noise and linearity characteristics. FIG. 6 illustrates the variation of phase noise to coupling capacitance.

Referring again to FIG. 2, it has been found that when coupling capacitor C7 has been optimized for phase noise and linearity in a given circuit configuration, that the introduction of transmission line TL1 between resonator RC1 and main tuning capacitor CR1 in accordance with the present invention has introduced immediate benefits of up 6 decibels improvement in phase noise and up to 10% improvement in tuning linearity over other configurations.

The immediate benefit of transmission line TL1 is further exploited, after configuring the line as a broad land or trace on the circuit board in the length, width and shape on a substrate of uniform dielectric constant as previously described, by insuring at the design stage that the trace will be physically accessible after all intended components have been secured to the board, as is clearly illustrated in FIGS. 3, 4 and 5. Then, in production testing, phase noise and linearity may be optimized by further tuning of the tank circuit by increasing or decreasing the effective length and surface area of transmission line TL1, thereby adjusting the L/C ratio and Q of the tank circuit.

A sliver of trace material is illustrated to have been cut off the outer edge of the trace of transmission line TL1 of FIG. 4 at point A, reducing the surface area and increasing the effective length of the trace. A jumper across the inner arc of the trace of transmission line is shown at point B of FIG. 5, increasing the surface area and decreasing the effective length of the line.

In summary, the location, length and width of a transmission line connecting the resonator and main tuning capacitor of an electronic oscillator of up to about fifteen percent (15%) bandwidth in accordance with the present invention provides the unexpected results of significantly improving the average phase noise and linearity performance of the design in production; while accessibility to the land of the transmission line, after the board is populated, enables the manufacturer to readily fine tune or optimize the phase noise and linearity characteristics of individual units without adverse effect on other circuit parameters and without other modifications in the circuit.

Although the present invention has been described with a certain degree of particularity, it is understood that the present disclosure has been made by way of example and that changes in details of structure and methodology may be made without departing from the spirit thereof.

What is claimed is:

1. An electronic oscillator of limited bandwidth comprising:

a resonant tank circuit including a resonator, a transmission line, a main capacitor, and a positive feedback signal for producing oscillations at a resonant frequency, said transmission line being at least one sixteenth (1/16) and not more than three sixteenths (3/16) wavelengths of said resonant frequency and configured to provide a conductive path between said resonator and said main capacitor; and a signal amplifier for overcoming losses to sustain oscillations in said tank circuit, said amplifier having an input and a feedback output, said amplifier being connected in a feedback loop for said tank circuit.

2. The electronic oscillator of claim 1, said transmission line being configured as a land on a substrate of uniform dielectric constant on a circuit board, said land being longer than distance between end points of said land, width of said land being in a range of forty to fifty thousandths (0.040–0.050) inch.

3. The electronic oscillator of claim 2, component layout of said circuit board configured to allow physical access to said transmission line after said board is populated with components.

4. The electronic oscillator of claim 2, said electronic oscillator being a variable frequency oscillator comprising means whereby variations in a signal parameter cause changes to said resonant frequency.

5. The variable frequency oscillator of claim 4, said oscillator being a voltage-controlled oscillator wherein said main capacitor is a varactor diode, anode end of which is electrically connected to said resonator, across which said diode is applied a DC signal voltage for controlling said resonant frequency.

6. The voltage-controlled oscillator of claim 5, further comprising a coupling capacitor connected between said amplifier and said varactor diode, wherein capacitive value of said main capacitor is much larger than capacitive value of said coupling capacitor so that said resonant frequency is primarily dependent on capacitive value of said main capacitor.

7. The voltage-controlled oscillator of claim 6, further comprising a fixed capacitor in parallel with said resonator.

8. The voltage-controlled oscillator of claim 6, said resonator being a ceramic resonator.

9. The voltage-controlled oscillator of claim 7, said resonator being a coil.

10. A voltage-controlled electronic oscillator of limited bandwidth comprising:

a resonant tank circuit including a ceramic resonator, a transmission line, a varactor diode, a positive feedback signal for producing oscillations at a resonant frequency, said transmission line being at least one sixteenth (1/16) and not more than three sixteenths (3/16) wavelengths long and configured as a land on a substrate of uniform dielectric constant on a circuit board to provide a conductive path between said resonator and anode end of said varactor diode;

a signal amplifier for overcoming losses to sustain oscillations in said tank circuit, said amplifier having an input and a feedback output, said amplifier being connected in a feedback loop for said tank circuit; and a coupling capacitor connected between said amplifier and said varactor diode, wherein capacitive value of said varactor diode is much larger than capacitive value of said coupling capacitor so that said resonant frequency is primarily dependent on capacitive value of said varactor diode;

said land of said transmission line being longer than distance between end points of said land, width of said land being in a range of forty to fifty thousandths (0.040–0.050) inch, component layout of said circuit board configured to allow physical access to said transmission line after said board is populated with components.

11. The voltage-controlled oscillator of claim 10, further comprising a fixed capacitor in parallel with said ceramic resonator.

12. A method for manufacturing electronic oscillators of limited bandwidth with improved, consistent phase noise and linearity characteristics comprising:

making a land on a substrate of uniform dielectric constant on a circuit board as a transmission line for connecting a resonator and a main tuning capacitor in a series resonant tank circuit of said oscillator, said transmission line being at least one sixteenth (1/16) and not more than three sixteenths (3/16) wavelengths of resonant frequency of said oscillator.

13. The method of claim 12, wherein length of said land is greater than distance between end points of said land, width of said land being in a range of forty to fifty thousandths (0.040–0.050) inch, said method comprising preliminary step:

laying out of said circuit board so as to provide space for physical access to said transmission line after said board is populated;

and further comprising concluding steps:

completing electrical assembly of said oscillator;

testing of said oscillator for phase noise and linearity; and adjusting phase noise and linearity of said oscillator to within production specifications by varying L/C ratio of said transmission line.

14. The method of claim 13, where increases in said L/C ratio of said transmission line are accomplished by removing material from said transmission line, and decreases in said L/C ratio are accomplished by any combination of adding material to said transmission and adding jumpers to shorten effective length of said transmission line.

15. The method of claim 14, wherein said electronic oscillator is a variable frequency oscillator comprising means whereby variations in a signal parameter cause changes to said resonant frequency.

16. The method of claim 15, said variable frequency oscillator being a voltage-controlled oscillator wherein said main capacitor is a varactor diode, anode end of which is electrically connected to said resonator by said transmission line, and across which said diode is applied a DC signal voltage for controlling said resonant frequency.

17. The method of claim 16, wherein said voltage-controlled oscillator further comprises a coupling capacitor connected between an amplifier and said varactor diode, wherein capacitive value of said main capacitor is much larger than capacitive value of said coupling capacitor so that said resonant frequency is primarily dependent on capacitive value of said main capacitor.

18. The method of claim 17, said voltage-controlled oscillator further comprising a fixed capacitor in parallel with said resonator.

19. The method of claim 17, said resonator being a ceramic resonator.

20. The method of claim 18, said resonator being a coil.

* * * * *